United States Patent [19]

Takase et al.

[11] Patent Number: 5,500,815
[45] Date of Patent: Mar. 19, 1996

[54] SEMICONDUCTOR MEMORY

[75] Inventors: Satoru Takase, Yokohama; Tohru Furuyama, Tokyo, both of Japan

[73] Assignee: Kabushiki Kaisha Toshiba, Kawasaki, Japan

[21] Appl. No.: 981,541

[22] Filed: Nov. 25, 1992

[30] Foreign Application Priority Data

Nov. 27, 1991 [JP] Japan .................................. 3-312398

[51] Int. Cl.⁶ ............................ G11C 11/24; G11C 11/40
[52] U.S. Cl. ....................... 365/149; 365/104; 257/296; 257/298; 257/300; 257/301; 257/304
[58] Field of Search .................................. 365/149, 182; 257/315

[56] References Cited

U.S. PATENT DOCUMENTS

| | | | |
|---|---|---|---|
| 3,763,480 | 10/1973 | Weimer | 340/173 R |
| 4,070,590 | 1/1978 | Ieda | 307/355 |
| 4,225,945 | 9/1980 | Kuo | 365/149 |
| 4,593,382 | 6/1986 | Fujishima | 365/149 |
| 4,648,073 | 3/1987 | Kenney | 365/149 |
| 4,669,063 | 5/1987 | Kirsch | 365/189 |
| 4,758,987 | 7/1988 | Sakui | 365/189 |
| 4,943,944 | 7/1990 | Sakui et al. | 365/189.05 |
| 4,980,863 | 12/1990 | Ogihara | 365/205 |
| 5,025,294 | 6/1991 | Ema | 357/23.6 |
| 5,051,954 | 9/1991 | Toda et al. | 365/189.02 |
| 5,079,746 | 1/1992 | Sato | 365/225.7 |
| 5,091,761 | 2/1992 | Hiraiwa | 357/23.6 |
| 5,091,885 | 2/1992 | Ohsawa | 365/203 |
| 5,172,198 | 12/1992 | Aritome et al. | 257/315 |
| 5,184,326 | 2/1993 | Hoffman | 365/201 |

FOREIGN PATENT DOCUMENTS

| | | |
|---|---|---|
| 0169460 | 1/1984 | European Pat. Off. . |
| 0273639 | 7/1988 | European Pat. Off. . |
| 0365720 | 5/1990 | European Pat. Off. . |
| 0398244 | 1/1992 | European Pat. Off. . |
| 0157051 | 1/1992 | European Pat. Off. . |
| 0499224 | 8/1992 | European Pat. Off. . |
| 4015472 | 8/1992 | Germany . |
| 1922761 | 8/1992 | Germany . |
| 62-197989 | 1/1987 | Japan . |
| 1-134796 | 5/1989 | Japan . |
| 4-212780 | 8/1992 | Japan . |

OTHER PUBLICATIONS

Shah et al., "A 4Mb DRAM with Cross-point Trench Transistor Cell", 1986 ISSCC Digest of Technical Papers, pp. 268–269.

Ema et al., "3–Dimensional Stacked Capacitor Cell for 16M and 64M DRAMs", 1988 IEDM Technical Digest, pp. 592–595.

Fujishima et al., "A Storage–Node–Boosted RAM with Word–Line Delay Compensation", IEEE Journal of Solid State Circuits., vol. SC–17, No. 5, pp. 872–875, Oct. 1982.

Ohta et al., "A Novel Memory Cell Architecture for High–Density DRAMs", 1989 Symposium of VLSI Circuits, Digest of Tech. Papers, pp. 101–102.

Arimoto et al., "A Circuit Design of Intelligent CDRAM with Automatic Write Back Capability", 1990 Symposium on VLSI Circuits, Digest of Technical Papers, pp. 79–80.

Watanabe et al., "Stacked Capacitor Cells for High–density dynamic RAMs", 1988 IEDM Technical Digest, pp. 600–603.

(List continued on next page.)

Primary Examiner—Viet Q. Nguyen
Attorney, Agent, or Firm—Banner & Allegretti

[57] ABSTRACT

A semiconductor memory cell comprises a first cascade gate, formed on a semiconductor substrate, having its end connected to a first node, and a plurality of MOS transistors which are connected in cascade, a plurality of data storage capacitors, formed on the semiconductor substrate, each of which has its end connected to that end of a corresponding one of the MOS transistors which is opposite to the first node, and a device isolation MOS transistor formed between the memory cell and another semiconductor memory cell which are arranged side by side on the semiconductor substrate.

39 Claims, 13 Drawing Sheets

OTHER PUBLICATIONS

Price, "Simultaneous Access Memory", IBM Technical Disclosure Bulletin, vol. 23, No. 4, Jul. 1980, New York, pp. 657–658.

Asakura et al., "Cell–Plate Line Connecting Complementary Bitline (C3) Architecture for Battery Operating DRAMs", 1991 Symposium on VLSI Circuits, May 30, 1991, pp. 59–60.

Ohta et al., "Quadruply Self–Aligned Stacked High–Capacitance RAM Using $Ta_2O_5$ High Density VLSI Dynamic Memory", IEEE Transactions on Electron Devices, vol. ED–29, No. 3, Mar. 1982, pp. 368–376.

Sunouchi et al., "A Surrounding Gate Transistor (SGT) Cell for 64/256 MBit DRAMS", 1989 IEDM Technical Digest, pp. 23–26.

Kimura, K. et al, "A Block–Oriented RAM with Half–Sized DRAM Cell and Quasi Folded Data–Line Architecture", ISSCC91, pp. 106–107, dated Feb. 14, 1991.

Kimura, K. et al, "A Block–Oriented RAM with Half–Sized DRAM Cell and Quasi Folded Data–Line Architecture", ISSCC91 Slide Supplement, pp. 70–71.

Chao, "Array Arrangement and Layout of Taper–Isolated Dynamic Gain RAM Cell", IBM Technical Disclosure Bulletin, vol. 25, No. 12, May 1983, New York, pp. 6387–6390.

Scheuerlein et al., "Shared Word Line DRAM–Cell", IEEE International Solid State Circuits Conference, vol. 27, 22 Feb. 1984, New York, pp. 280–281.

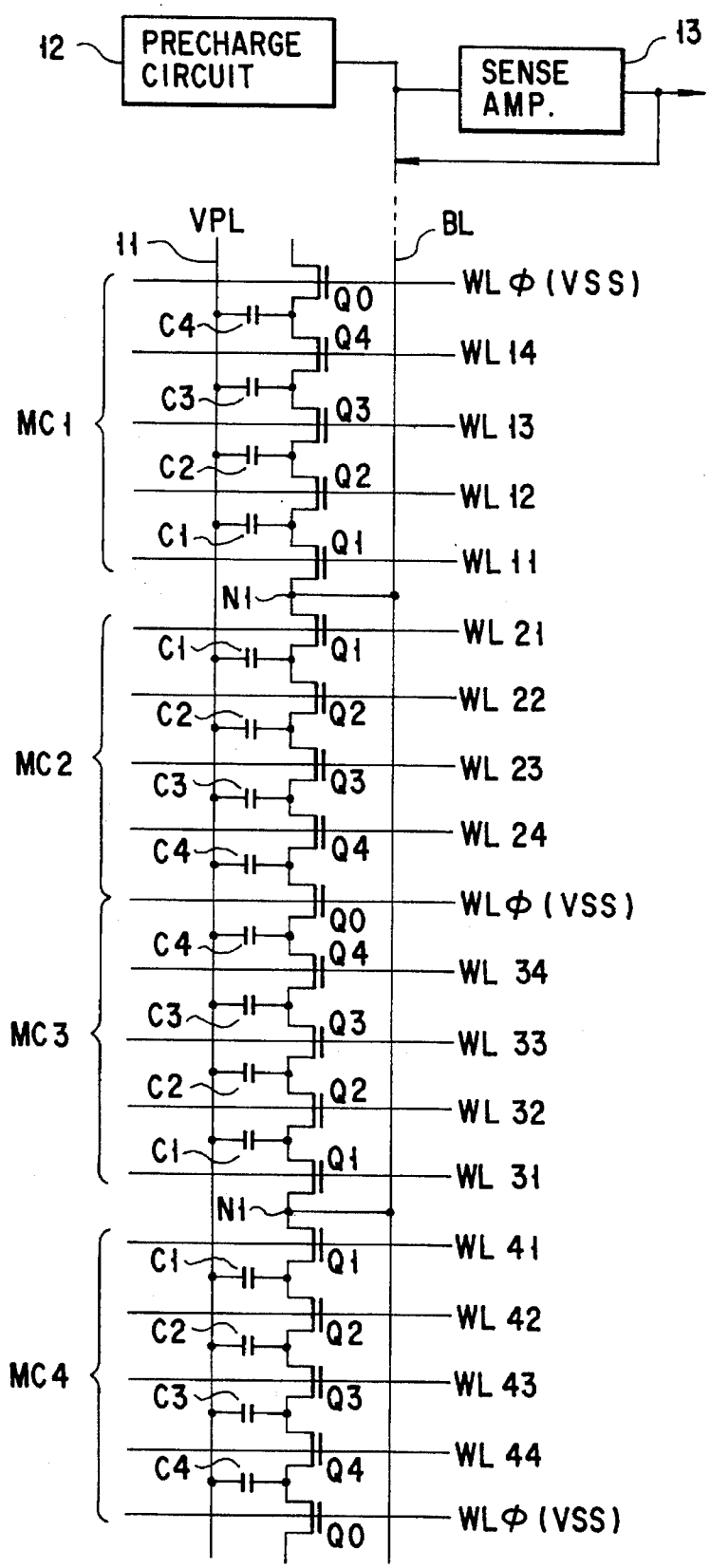
F I G. 6

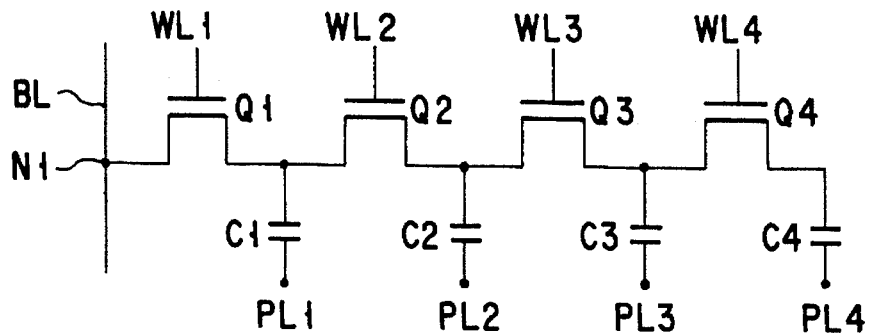
F I G. 10
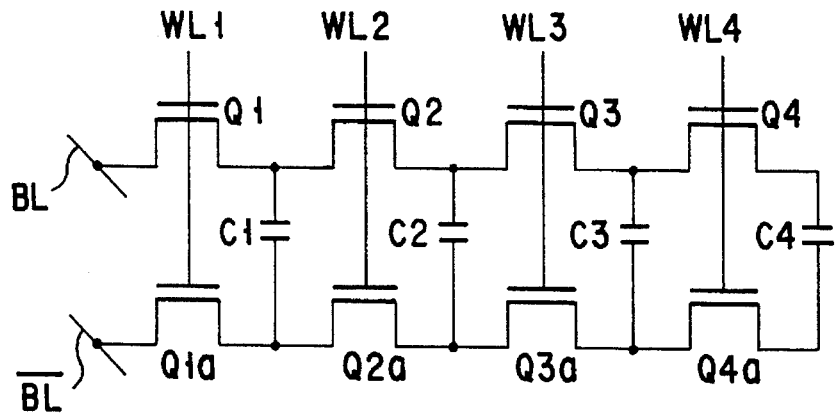
F I G. 11
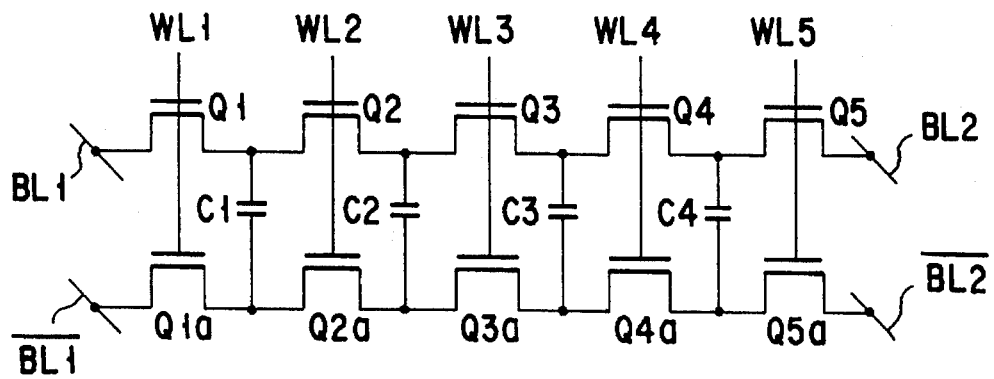
F I G. 12

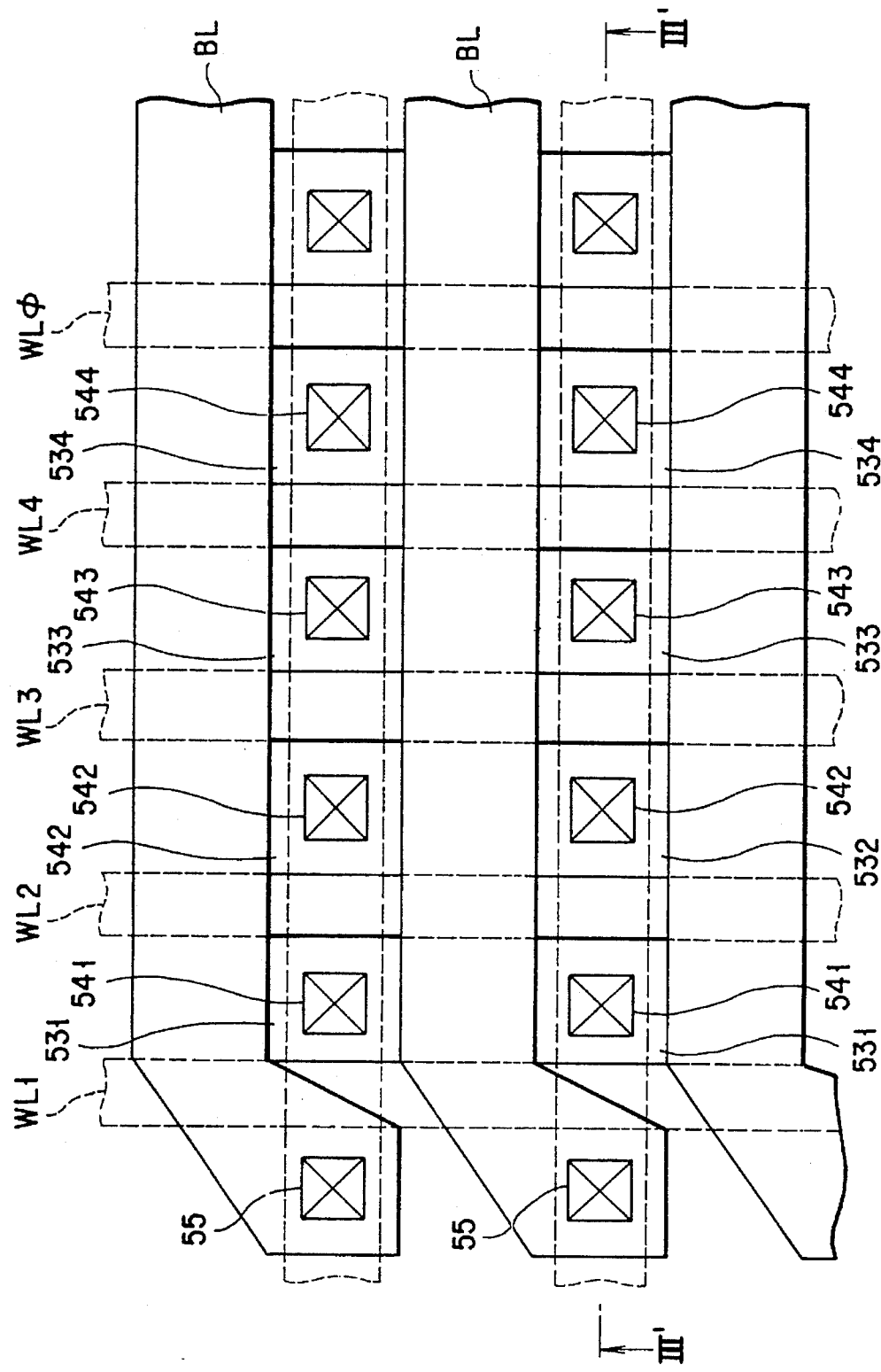
F I G. 17

SEMICONDUCTOR MEMORY

BACKGROUND OF THE INVENTION

1. Field of the Invention

The invention relates to semiconductor memory cells and, more specifically, to memory cells for use in a memory such as a dynamic random access memory (DRAM).

2. Description of the Related Art

FIG. 1 illustrates a DRAM memory cell presently available. This memory cell is constructed from a single MOS (insulated gate) transistor Q, serving as a transfer gate, which is connected to a word line WL and a bit line BL, and a data storage capacitor C connected at its end to the transistor. The other end of the capacitor C is connected to a capacitor plate potential VPL.

For the purpose of increasing the packing density of DRAM cells and lowering cost per bit, one of the inventors of the present invention has proposed a semiconductor memory cell that has such a cascade gate type of structure as shown in FIG. 2 or FIG. 3 (U.S. application Ser. No. 687,687).

The DRAM cell shown in FIG. 2 has cascade-connected MOS transistors Q1 to Q4 and data storage capacitors C1 to C4 having their respective ends connected to ends of the transistors Q1 to Q4. By turning on/off the transistors Q1 to Q4 in a predetermined sequence, stored data on the capacitors C1 to C4 can be read out onto a read/write node N1 in a sequence beginning with the capacitor C1 nearest to the end of the cascade connection, i.e., the node N1, or data at the node N1 can be written onto the capacitors C1 to C4 in a sequence beginning with the capacitor C4 farthest from the node N1.

In the DRAM cell shown in FIG. 3, a MOS transistor Q5 is further connected between one end of the transistor Q4 in the DRAM cell of FIG. 2 and a second node N2. With this type of DRAM cell, by turning on/off the transistors Q1 to Q5 in a predetermined sequence, stored data on the capacitors C1 to C4 can be read out onto the node N1 in a sequence beginning with the capacitor C1 nearest to the node N1, or data at the node N2 can be written onto the capacitors C1 to C4 in a sequence beginning with the capacitor C1 nearest to the node N1.

Such a cascade gate type of memory cell as shown in FIG. 2 or FIG. 3 is capable of storing data bit by bit. In an array of the memory cells, only one cell-to-bit-line contact is needed for every plural bits. The array can therefore realize much higher packing density than a DRAM using an array of conventional single-transistor single-capacitor memory cells and reduce cost per bit drastically.

FIGS. 4 and 5 are a plan view and a sectional view of the cascade gate cell of FIG. 2 which are disclosed in the U.S. application described previously. In these figures there is illustrated a case where the cascade gate cell is implemented as a stacked capacitor cell structure and used in an open bit line type of DRAM cell array in which capacitors are disposed in the neighborhood of intersections of word lines and a bit line.

In FIGS. 4 and 5, 50 denotes a semiconductor substrate, 52 denotes a cell active region in which the active regions (each consisting of a source, a drain and a channel region) of four transistors Q1 to Q4 are disposed linearly in the major surface of the semiconductor substrate, WL1 to WL4 denote gates (word lines) of the four transistors Q1 to Q4, 531 to 534 designate storage nodes of four data storage capacitors C1 to C4, 541 to 544 denote contacts between the storage nodes of the capacitors C1 to C4 and the sources of the transistors Q1 to Q4, 55 denotes a contact (bit line contact) between a bit line BL and an end of the cell active region (the drain region of the transistor Q1), 56 denotes a gate insulating layer, 57 denotes an interlayer insulating layer, 58 denotes an insulating layer of each of the capacitors C1 to C4, 59 denotes a plate electrode of the capacitors C1 to C4, 60 designates an interlayer insulating layer, and 51 designates a field isolation region for providing electrical isolation between memory cells which are arranged side by side in the direction in which the cascade-connected transistors are arranged.

With the cascade gate type of cell described above, when stored data on the capacitors C1 to C4 are read out onto the node N1 in sequence, a capacitor (for example, C1) which has been read from remains electrically coupled to the node N1. Thus, data read out of another capacitor (for example, C2) would also be distributed to the capacitor C1. If, in this case, the capacitors C1 to C4 are equal to one another in capacitance, a variation in voltage at the node N1 when the capacitor C1 is read from is the greatest, and the voltage variations when the capacitors C2, C3 and C4 are read in sequence decrease gradually. In an extreme case, since readout charges from the capacitor C4 are distributed to the capacitors C1 to C3, a voltage variation at the node N1 may become so small as to develop data readout errors.

In view of this point, the inventors of this application have proposed a semiconductor memory cell which permits voltage variations at the node when stored data on capacitors are read in sequence to be made substantially equal to one another (U.S. application Ser. No. 833,045).

This memory cell is characterized in that a plurality of data storage capacitors in a cascade gate type of cell are given a certain rule for their capacitance values. For example, the capacitance values of the capacitors C1 to C4 may be given a rule relating to the order of data readout, i.e., the order in which the capacitors are read from. If the capacitors are set to have capacitance values according to the order of data readout so that the capacitor that is read first has a minimum value, gradual decrease in voltage variations at the node when the capacitors are read from in sequence can be moderated or avoided. Thus, the voltage variations can be made substantially equal to one another, permitting data readout errors to be avoided.

If, however, the field oxide film 51 is used to provide isolation between memory cells as shown in FIG. 5 when an array of cascade gate cells is created, such field oxide films will be scattered in the area in which gate lines (word lines WL1 to WL4) of the memory cell MOS transistors Q1 to Q4 are arranged regularly, spoiling the pattern regularity on the substrate. If there were discontinuous points in a pattern, difficulties would arise in the IC manufacturing process, adversely affecting the pattern density.

In addition, at the top of the oxide film 51 the pattern flatness is lost, adversely affecting polysilicon lines and aluminum lines formed over the oxide layer.

An example of a conventional DRAM cell which uses an interelement isolation technique differing from field oxide films is disclosed in an article entitled "A 1-Mbit CMOS Dynamic RAM with Design-For Test Function" by Hugh Mcadams et al., IEEE Journal of Solid-State Circuits, Vol. SC-21, No. 5, OCT. 1986, Page 640. In this example, electrical isolation between a DRAM cell capacitor and a bit line is provided by a polysilicon line set at ground potential.

Moreover, as shown in FIGS. 4 and 5, the bit line contact 55 will also spoil the pattern regularity on the substrate. That is, charge storage conductors 531 to 534 of the capacitors C1 to C4, which are made of, for example, polysilicon, are provided on the source regions of the transistors Q1 to Q4, but there is no charge storage polysilicon on the drain region of the transistor Q1.

Furthermore, the bit line BL is brought in direct contact with the drain region of the transistor Q1. Thus, a contact hole for the direct contact must be formed deep in the interlayer insulating layer 57. This makes the manufacturing process difficult and has an adverse influence on the increasing of the pattern density.

As described above, the presently proposed cascade gate type memory cells have room for improvements in isolation between memory cells or contact at an end of a memory cell.

SUMMARY OF THE INVENTION

It is therefore an object of the present invention to provide a semiconductor memory cell which permits a high-density memory to be implemented, the cost per bit to be reduced considerably, the manufacturing process to be made easy, and the pattern density to be increased.

According to a first aspect of the present invention, there is provided a semiconductor memory cell comprising: a first cascade gate, formed on a semiconductor substrate, having its end connected to a first node, and a plurality of MOS transistors which are connected in cascade; a plurality of data storage capacitors, formed on said semiconductor substrate, each of which has its end connected to that end of a corresponding one of said MOS transistors which is opposite to said first node; and a device isolation MOS transistor formed between said memory cell and another semiconductor memory cell which are arranged side by side on said semiconductor substrate.

In this semiconductor memory cell, the cell isolation MOS transistor, which is formed between cascade-gate memory cells, is supplied at its gate with a gate potential so that it is constantly placed in the off state, thereby providing electrical isolation between memory cells.

In making an array of such memory cells as described above, the prior need is eliminated for field oxide layers adapted for cell isolation to be scattered in an area in which gate lines of the memory cell MOS transistors are arranged with regularity, realizing the pattern regularity on the substrate. As a result, the IC manufacturing process is made simple, and the pattern density can be increased.

In addition, the gate electrode of the device isolation MOS transistor can be formed in the same pattern on the same wiring layer by the same process as the gate electrodes of the cascade-connected MOS transistors. This will not adversely affect pattern flatness and polysilicon and aluminum lines formed above.

According to a second aspect of the present invention, there is provided a semiconductor memory cell comprising: a first cascade gate, formed on a semiconductor substrate, having its end connected to a first node, and a plurality of MOS transistors which are connected in cascade; a plurality of data storage capacitors, formed on said semiconductor substrate, each of which has its end connected to that end of a corresponding one of said MOS transistors which is opposite to said first node; and a conductor formed on said semiconductor substrate so that it is in contact with an end of an active region for said cascade gate, said conductor being connected to said first node, each of said charge storage capacitors having a charge storage conductor which is in contact with an end of an active region for a corresponding one of said MOS transistors.

According to this semiconductor memory cell, a conductor is formed which is in contact with an end of the active region for the cascade gate. The conductor can be formed in the same pattern, on the same wiring layer by the same process as the charge storage conductors of the data storage capacitors.

Thus, the charge storage conductors of the data storage capacitors and the conductor are arranged side by side with regularity, realizing the pattern regularity on a substrate. In addition, the existence of the conductor that is in contact with the end of the cascade-gate active region allows the mask alignment tolerance for a contact hole to be formed on the conductor to increase and the contact hole to be formed shallow in comparison with the case where the conductor does not exist. Thus, the IC manufacturing process is made simple and the pattern density can be increased.

According to a third aspect of the present invention, there is provided a semiconductor memory cell comprising: a first cascade gate, formed on a semiconductor substrate, having its end connected to a first node, and a plurality of MOS transistors which are connected in cascade; a plurality of data storage capacitors, formed on said semiconductor substrate, each of which has its end connected to that end of a corresponding one of said MOS transistors which is opposite to said first node; a device isolation MOS transistor formed between said memory cell and another semiconductor memory cell which are arranged side by side on said semiconductor substrate; and a conductor formed on said semiconductor substrate so that it is in contact with an end of an active region for said cascade gate, said conductor being connected to said first node, each of said charge storage capacitors having a charge storage conductor which is in contact with an end of an active region for a corresponding one of said MOS transistors.

This semiconductor memory cell, which combines the features of the semiconductor memory cell according to the first aspect and the features of the semiconductor memory cell according to the second aspect, can provide the advantages of the memory cells of the first and second aspects.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a circuit diagram of a portion of a memory cell array in a DRAM using a semiconductor memory cell according to a first embodiment of the present invention;

FIG. 10 is an equivalent circuit diagram of a modification of the memory cell of FIG. 6;

FIG. 11 is an equivalent circuit diagram of another modification of the memory cell of FIG. 6;

FIG. 12 is an equivalent circuit diagram of still another modification of the memory cell of FIG. 6;

FIG. 17 illustrates another example of a pattern layout of the memory cell of FIG. 6.

DETAILED DESCRIPTION OF THE PREFERRED EMBODIMENTS

Figure 1:
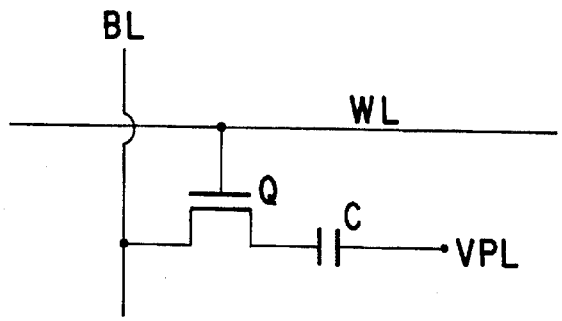
FIG. 1 is an equivalent circuit diagram of a conventional single-transistor single-capacitor DRAM cell.

Reference will now be made to the drawings to describe several embodiments of the present invention. In the drawings, like reference characters are used to designate like or corresponding parts throughout the several views, thereby avoiding repeated description thereof.

FIG. 6 illustrates a portion of one column of a memory cell array in a DRAM using memory cells of a cascade gate type according to a first embodiment of the present invention.

Figure 2:
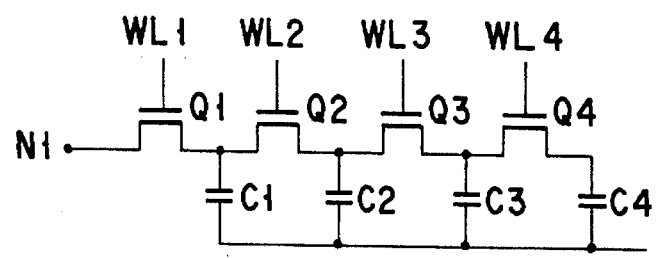
FIG. 2 is an equivalent circuit diagram of an example of a presently proposed cascade gate type of memory cell.
Figure 3:
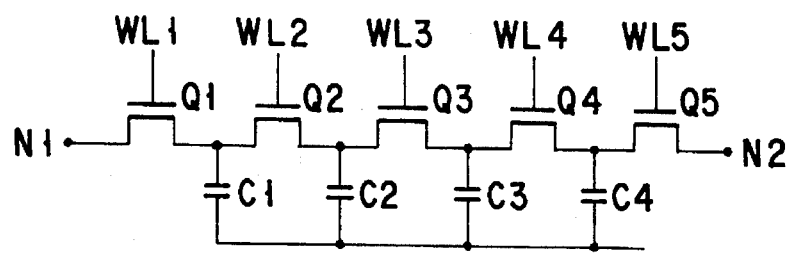
FIG. 3 is an equivalent circuit diagram of another example of a presently proposed cascade gate type of memory cell.
Figure 4:
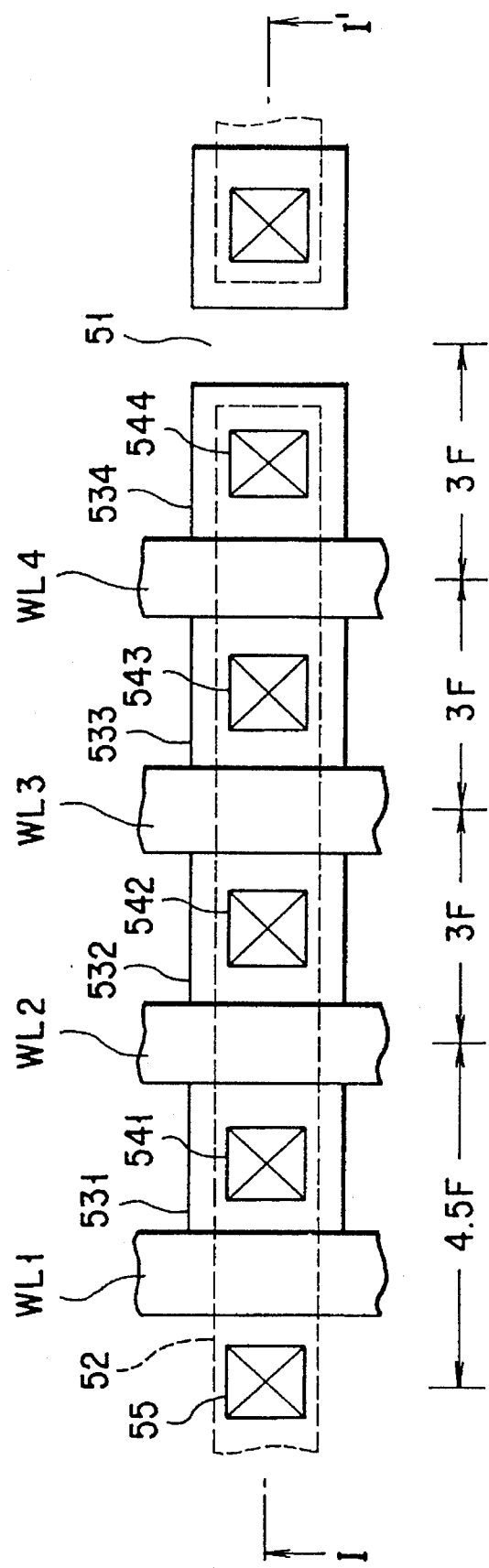
FIG. 4 illustrates an example of a pattern layout when the memory cell of FIG. 2 is used in an open bit type of DRAM cell array as stacked capacitor cell structure.

In this memory cell array, memory cells of a cascade gate type as shown in FIG. 2 are arranged to have an open bit line configuration or a single-ended sense amplifier configuration. Four memory cells MCi (i=1, 2, 3, 4) are shown for the purpose of simplifying illustration.

BL designates a bit line, and WLi1 to WLi4 denote word lines which are driven by a word line driver (not shown). Q0 designates an N-channel enhancement MOS transistor adapted for device isolation, and WL0 designates a gate line for the transistor Q0, which is supplied with ground potential Vss or a negative substrate bias potential VBB.

The memory cell MCi is composed of a first cascade gate having a plurality of cascade-connected MOS transistors (four transistors Q1 to Q4 in the example shown) of which an end is connected to a node N1 and a plurality of data storage capacitors C1 to C4 each of which has an end connected to that end of a corresponding one of the transistors Q1 to Q4 which is opposite to the node N1. The transistors and the capacitors are formed on the same semiconductor substrate. The node N1 is connected to the bit line BL.

The gates of the transistors Q1 to Q4 in the memory cell MCi are connected to word lines WLi1 to WLi4, respectively. Each of the word lines WLi1 to WLi4 is connected in common to the gates of corresponding transistors in a group of memory cells (not shown) in the same row in the memory cell array. The other ends of the capacitors C1 to C4 are connected together to a capacitor line 11 in the memory cell array. In this example, the plate electrodes of the capacitors C1 to C4 are connected together to receive a capacitor plate potential VPL that is common to other DRAM cells.

Reference numeral 12 denotes a bit line precharge circuit connected to the bit line BL, and 13 denotes a sense amplifier for sensing and amplifying a potential on the bit line BL.

Figure 7:
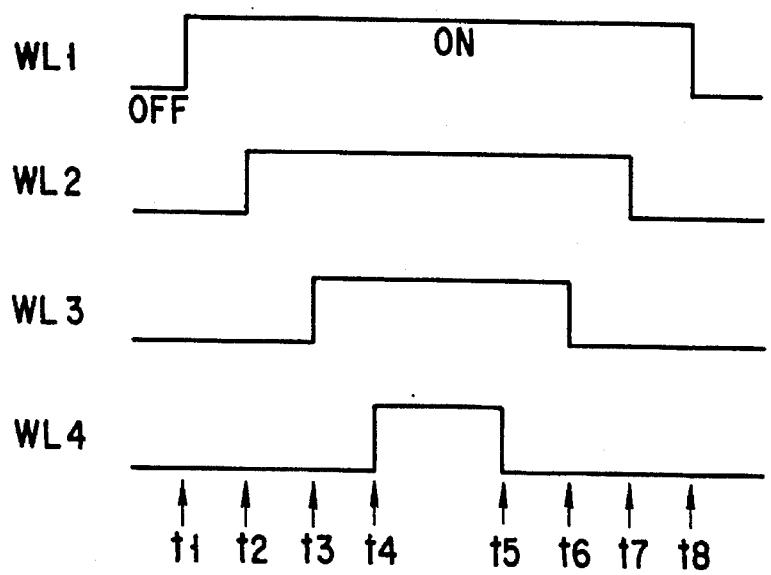
FIG. 7 is a timing diagram for use in explanation of read and write operations of the memory cell of FIG. 6.

Next, reference is made to a timing diagram of FIG. 7 to describe reading from and writing into a cascade gate cell MCi in FIG. 6. Here, the word lines of the memory cell are denoted by WL1 to WL4.

The word lines WL1 to WL4 are turned on and off (driven) at times as shown in FIG. 7 so as to render the transistors Q1 to Q4 conductive in the order of Q1, Q2, Q3, and Q4 and then render them nonconductive in the order of Q4, Q3, Q2 and Q1. That is, when the word line WL1 is turned on at a time t1 after the bit line BL is precharged to a predetermined potential by the bit line precharge circuit 12, the transistor Q1 is rendered conductive, so that stored data on the capacitor C1 is read onto the bit line BL via the transistor Q1 and then sensed by the sense amplifier 13.

When the word line WL2 is turned on at a time t2 after the bit line BL is precharged again for a fixed period of time, the transistor Q2 is rendered conductive, so that stored data on the capacitor C2 is read onto the bit line BL via the transistors Q2 and Q1.

Next, when the word line WL3 is turned on at a time t3 after the bit line BL is precharged again, the transistor Q3 is rendered conductive, so that stored data on the capacitor C3 is read onto the bit line BL via the transistors Q3, Q2 and Q1.

When the word line WL4 is turned on at a time t4 after the bit line BL is precharged again, the transistor Q4 is rendered conductive, so that stored data on the capacitor C4 is read onto the bit line BL via the transistors Q4, Q3, Q2 and Q1.

Next, when the word line WL4 is turned off at a time t5, the transistor Q4 is rendered nonconductive, so that data on the bit line BL is written onto the capacitor C4.

Next, when the word line WL3 is turned off at a time t6, the transistor Q3 is rendered nonconductive, so that data on the bit line BL is written onto the capacitor C3.

Next, when the word line WL2 is turned off at a time t7, the transistor Q2 is rendered nonconductive, so that data on the bit line BL is written onto the capacitor C2.

Finally, when the word line WL1 is turned off at a time t8, the transistor Q1 is rendered nonconductive, so that data on the bit line BL is written onto the capacitor C1.

Note that, during the interval between the sequential reading and the sequential writing as described above, in other words, during the interval between the times t4 and t5, processes, such as resequencing of data that have been read out, error correction, etc., may be performed.

According to the cascade gate memory cell shown in FIG. 6, on/off control of the cascade-connected transistors Q1 to Q4 in a predetermined sequence permits stored data on the capacitors Q1 to Q4 to be read out onto the first node N1 in the sequence from the capacitor C1 nearest to the node to the capacitor C4 farthest from the node.

Moreover, on/off control of the transistors Q1 to Q4 in a predetermined sequence permits data at the node N1 to be written (rewritten) onto the capacitors Q1 to Q4 in the sequence from the capacitor C4 farthest from the node to the capacitor C1 nearest to the node.

The memory cell array of FIG. 6 is arranged such that the node N1 is connected to the bit line BL. Alternatively, the node N1 may be directly connected to the input of the sense amplifier 13.

Figure 8:
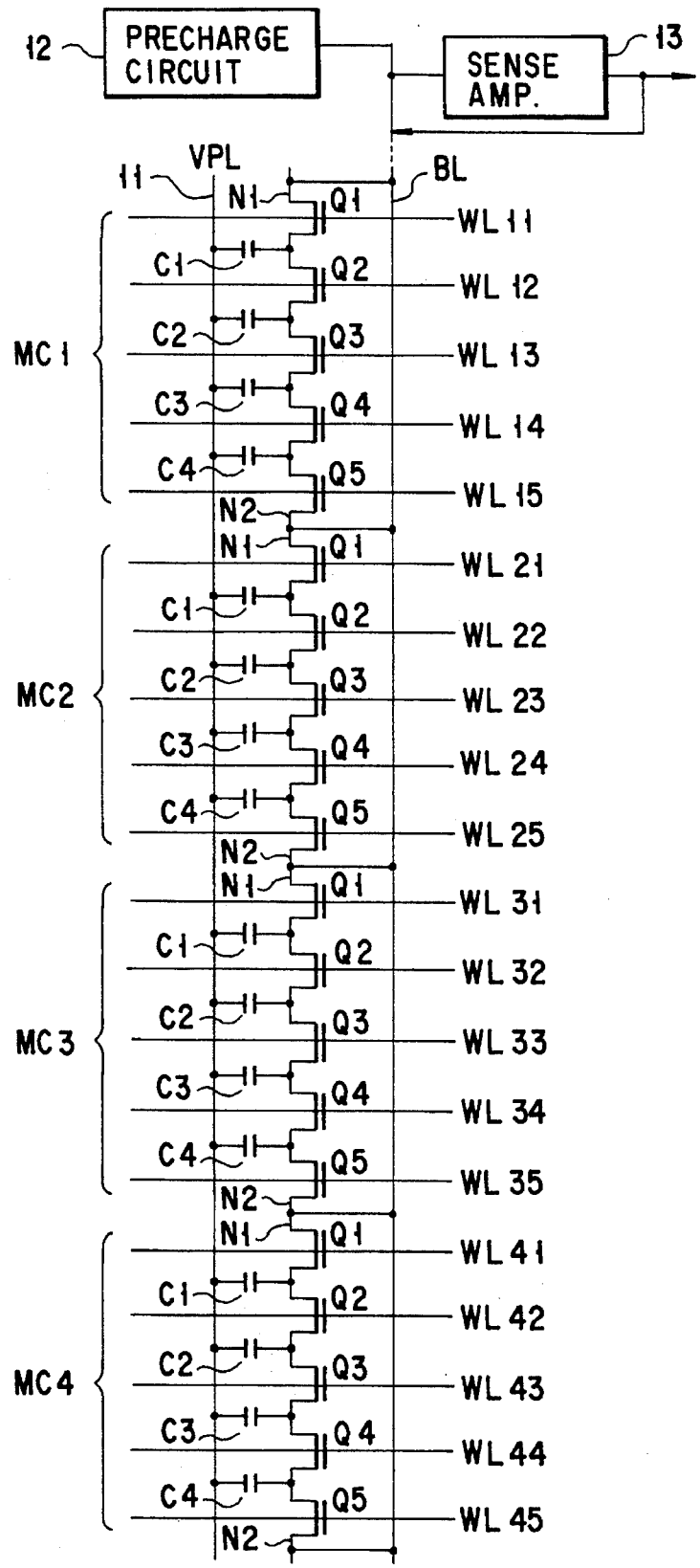
FIG. 8 is a circuit diagram of a portion of a memory cell array in a DRAM using a semiconductor memory cell according to a second embodiment of the present invention.

FIG. 8 illustrates a portion of one column of a memory cell array in a DRAM using cascade gate memory cells according to a second embodiment of the present invention.

In the cascade gate memory cells, a second MOS transistor Q5 is connected between an end (on the transistor Q4 side) of the cascade gate in the cell shown in FIG. 2 and a second node N2.

In other words, this cascade gate type of memory cell is equipped with a cascade gate having three or more MOS transistors Q1 to Q5 (five in this example) which are connected in cascade between the first and second nodes N1 and N2, and a plurality of data storage capacitors C1 to C4 having their respective ends connected to nodes of the cascade-connected MOS transistors. In the present embodiment, the first node N1 and the second node N2 are connected in common to the bit line BL of the memory cell array.

The transistors Q1 to Q5 in the memory cell MCi have their respective gates connected to word lines WLi1 to WLi5 which are also respectively connected to the gates of transistors Q1 to Q5 in each of memory cells (not shown) of the same row of the memory cell array. The other ends of the capacitors C1 to C4 are connected together to the capacitor line 11 of the memory cell array (in this embodiment, the capacitor line is supplied with a capacitor plate potential VPL).

Next, an example of a read/write operation of the DRAM cell shown in FIG. 8 will be described with reference to a timing diagram of FIG. 9. Here, the word lines of the memory cell are denoted by WL1 to WL5.

Figure 9:
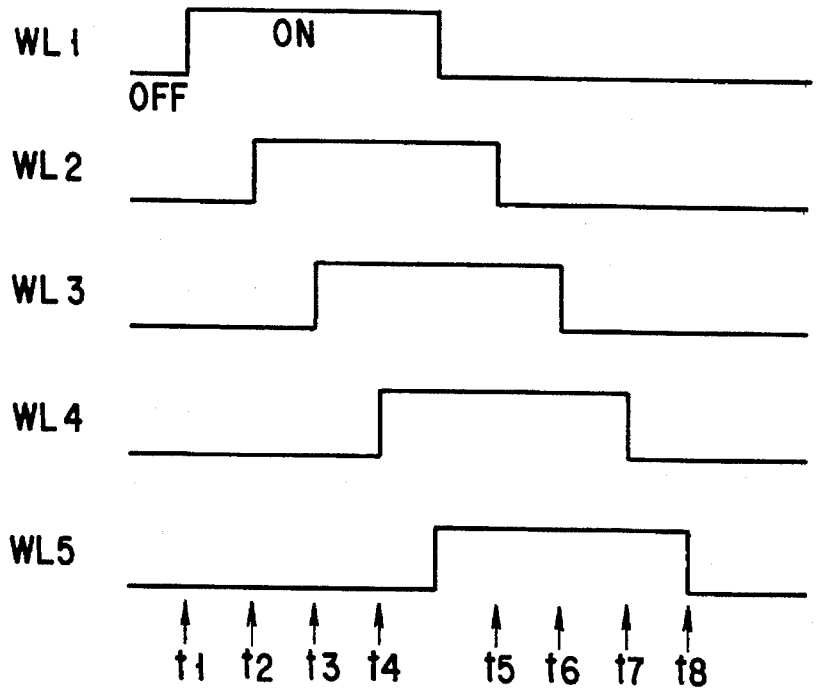
FIG. 9 is a timing diagram for use in explanation of read and write operations of the memory cell of FIG. 8.

The word lines WL1 to WL5 are subjected to on/off control at times as shown in FIG. 9 so that the transistors Q1 to Q5 are rendered conductive in the order of Q1, Q2, Q3, Q4 and Q5 and then rendered nonconductive in the same order. That is, by rendering the transistors Q1 to Q5 conductive in the order of Q1, Q2, Q3, Q4 and Q5, stored data on the capacitors C1 to C4 can be read out onto the node N1 in the order of C1 (nearest to the node N1), C2, C3, and C4 (farthest from the node N1) as is the case with the operation described with reference to FIG. 7. Subsequently, the word line WL1 is turned off to render the transistor Q1 nonconductive and the word line WL5 is turned on to render the transistor Q5 conductive (this operation may be reversed).

Next, when the word line WL2 is turned off at a time t5, the transistor Q2 is rendered noncoductive, permitting data at the node N2 to be written onto the capacitor C1.

Next, when the word line WL3 is turned off at a time t6, the transistor Q3 is rendered nonconductive, so that data at the node N2 is written onto the capacitor C2.

Next, when the word line WL4 is turned off at a time t7, the transistor Q4 is rendered nonconductive, so that data at the node N2 is written onto the capacitor C3.

Next, when the word line WL5 is turned off at a time t8, the transistor Q5 is rendered nonconductive, so that data at the node N2 is written onto the capacitor C4.

During the interval between the sequential reading operation and the sequential writing operation, that is, during the interval between the times t4 and t5, processes, such as transfers of readout data, correction of errors, etc., may be performed.

According to the cascade gate cell shown in FIG. 8, on/off control of the transistors Q1 to Q5 in a predetermined sequence permits stored data on the capacitors C1 to C4 to be read out onto the first node N1 in the sequence from the nearest capacitor C1 to the first node to the farthest capacitor C4 from the first node. In addition, on/off control of the transistors Q1 to Q5 in a predetermined sequence permits data at the second node N2 to be written onto the capacitors C1 to C4 in the sequence from the nearest capacitor C1 to the first node to the farthest capacitor C4 from the first node.

Although, in the DRAM cell of FIG. 8, the first node N1 and the second node N2 are shown connected in common to the same bit line BL, they may be connected to separate bit lines or separate sense amplifiers.

If the word lines WL1 to WL5 were driven in the order from WL5 to WL1 opposite to that shown in FIG. 9 so as to render the transistors Q1 to Q5 conductive in the order from Q5 to Q1 and then render them nonconductive in the order from Q5 to Q1, stored data on the capacitors C1 to C4 could be read out onto the second node N2 in the order from C4 to C1 and then data at the first node N1 could be written onto the capacitors in the order from C4 to C1.

If, in the cell of FIG. 8, the transistor Q1 or Q5, one of the transistors at both ends of the cascade gate, were placed in the off state, and the remaining transistors Q2 to Q5 or Q1 to Q4 were subjected to on/off control like the four transistors in the DRAM cell shown in FIG. 6, data transfers could be made between the cell and the first node N1 or between the cell and the second node N2.

Although, in the DRAM cell of FIG. 8, the ends of the capacitors C1 to C4 are shown connected in common to the capacitor plate potential VPL, they may be connected in common to an externally applied supply potential VCC or ground potential VSS.

Moreover, the DRAM cell of the present invention may also be implemented by the use of such a technique of clocking the capacitor plates as disclosed in an article entitled "A Storage-Node-Boosted RAM with Word-Line Delay Compensation" by K. Fujishima et al, IEEE JOURNAL OF SOLID-STATE CIRCUITS, Vol. SC-17, No. 5, p. 872, OCT. 1982.

In FIG. 10, there is shown an equivalent circuit diagram when that technique is applied to the DRAM cell of FIG. 6. PL1 to PL4 denote capacitor lines to which the ends of the capacitors C1 to C4 are connected.

Furthermore, the memory cell of the present invention may be implemented by the use of such a technique of connecting transfer gates to capacitor ends as disclosed in FIG. 1(b) in an article entitled "A Novel Memory Cell Architecture for High-Density DRAMs" by Y. OHTA et al., 1989 Symposium of VLSI Circuits, Digest of Tech. Papers, pp. 101–102.

An equivalent circuit diagram of a memory cell when that technique is applied to the DRAM cell of FIG. 6 is illustrated in FIG. 11, and an equivalent circuit diagram of a memory cell when the technique is applied to the DRAM cell of FIG. 8 is illustrated in FIG. 12.

In FIG. 11, Q1a to Q4a denote transfer gate MOS transistors which are connected in cascade. The transistors Q1a to Q4a are connected at their respective sources to the capacitors C1 to C4 and at their respective gates to the gates of the transistors Q1 to Q4. The transistors Q1 and Q1a are connected at their respective drains to complementary bit lines BL and /BL.

Note that the drains of the transistors Q1 and Q1a may be directly connected to a pair of differential inputs of a sense amplifier.

In FIG. 12, Q1a to Q5a denote transfer gate MOS transistors which are connected in cascade. The four connection nodes of the transistors Q1a to Q5a are connected to the capacitors C1 to C4, respectively. The gates of the transistors Q1a to Q5a are connected to the gates of the transistors Q1 to Q5, respectively. The ends of the transistors Q1 and Q1a are connected to complementary bit lines BL1 and /BL1, respectively, and the other ends of the transistors Q5 and Q5a are connected to complementary bit lines BL2 and /BL2, respectively.

It is to be noted that the other ends of the transistors Q5 and Q5a may be connected to the complementary bit lines BL1 and /BL1, respectively, in common with the respective ends of the transistors Q1 and Q1a.

In the above-described embodiments, each capacitor is arranged to store a single bit of a 1 or a 0. The circuit may be designed to store data of two or more bits (multivalued data) on a single capacitor.

The application of the technique, which determines capacitance values of the capacitors C1 to C4 according to a certain rule, e.g., a rule relating to the data readout sequence, disclosed in the aforesaid U.S. patent application No. 833,045 to the memory cells shown in FIG. 6, and FIGS. 10, 11 and 12 permits voltage variations at the read/write node N1 when the capacitors are read from in sequence to be made substantially equal to one another. This eliminates data readout errors.

Next, an example of a structure of the cascade gate memory cell of the present invention will be described.

Figure 13:
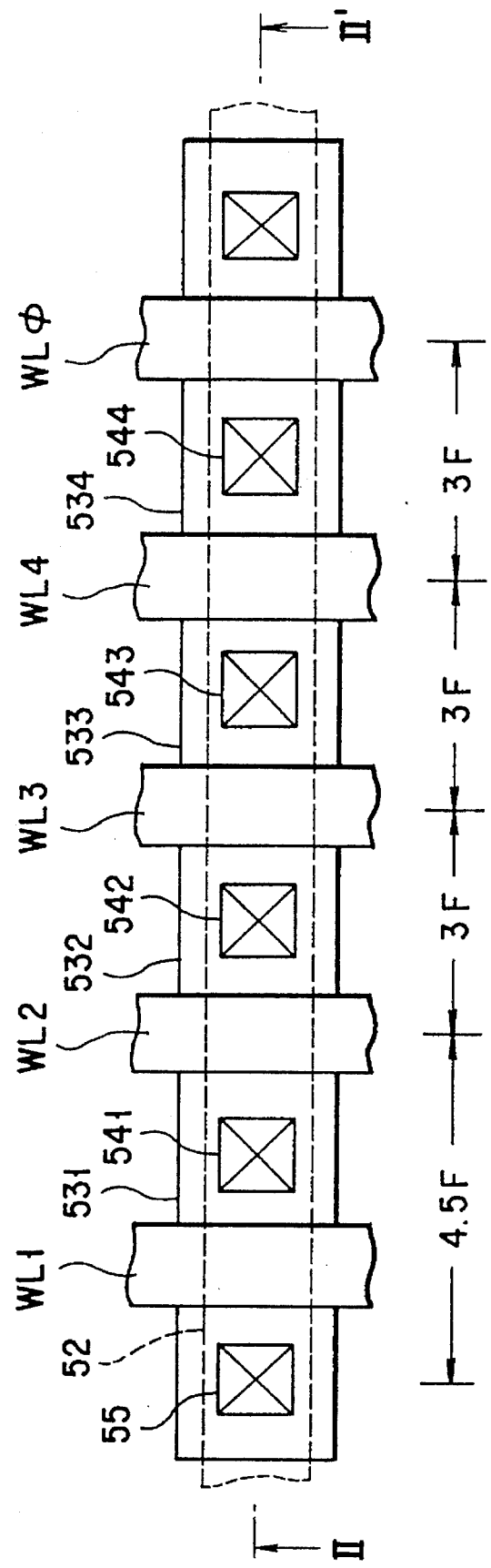
FIG. 13 illustrates an example of a pattern layout when the memory cell of FIG. 6 is used in an open bit type of DRAM cell array as stacked capacitor cell structure.

FIG. 13 illustrates a pattern layout of the cell of FIG. 6 when it is implemented as a stacked capacitor cell structure and used in a DRAM cell array (for example, an open bit line type of DRAM cell array) in which a storage node is disposed in the neighborhood of each of the intersections of word lines and bit lines.

Figure 14:
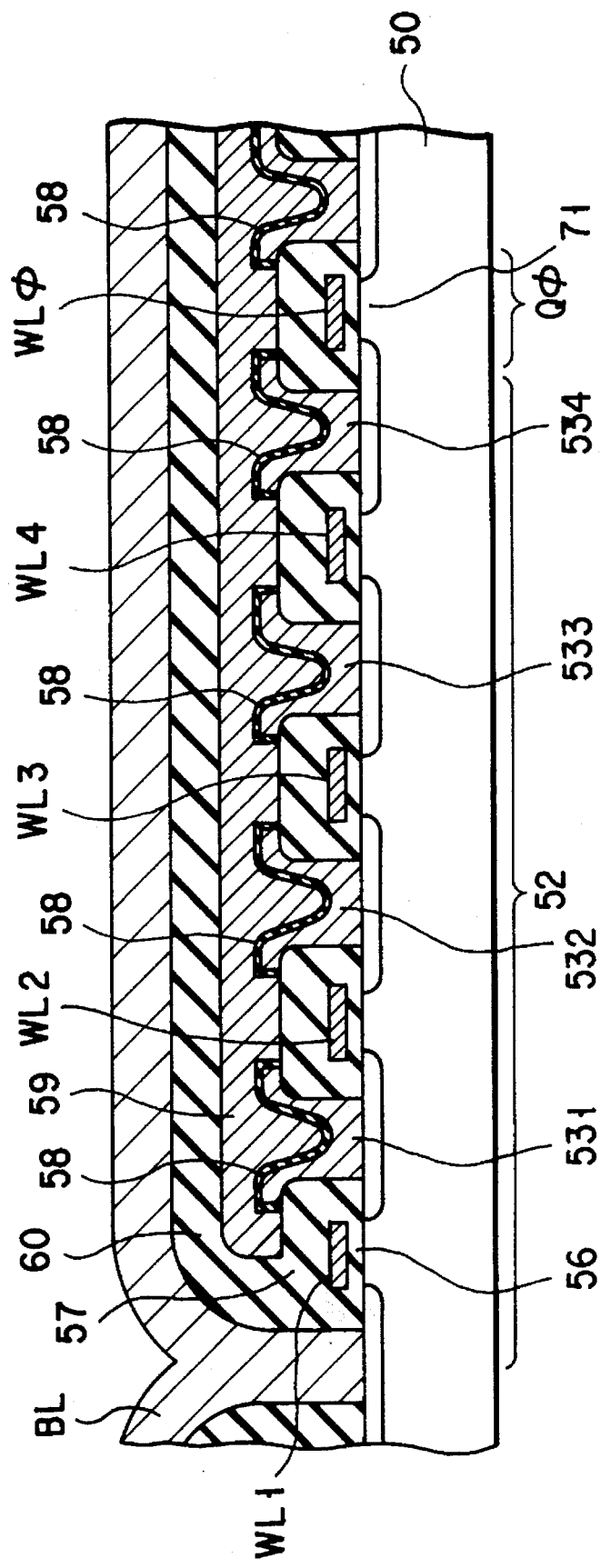
FIG. 14 illustrates an example of a sectional structure of the memory cell of FIG. 6.

FIG. 14 is a sectional view taken along line II—II in FIG. 13.

In FIGS. 13 and 14, 50 denotes a semiconductor substrate, 52 denotes a cell active region in which the active regions (each consisting of a source, a drain and a channel region) of four transistors Q1 to Q4 are disposed linearly in the major surface of the semiconductor substrate, WL1 to WL4 denote gates (word lines) of the four transistors Q1 to Q4, 531 to 534 designate storage nodes of four data storage capacitors C1 to C4, 541 to 544 denote contacts between the storage nodes of the capacitors C1 to C4 and the sources of the transistors Q1 to Q4, 55 denotes a contact (bit line contact) between a bit line BL and the drain region of the transistor Q1, 56 denotes a gate insulating layer, 57 denotes an interlayer insulating layer, 58 denotes an insulating layer of each of the capacitors C1 to C4, 59 denotes a common plate electrode of the capacitors C1 to C4, and 60 designates an interlayer insulating layer.

Q0 designates a MOS transistor for device isolation, which is formed between memory cells which are arranged side by side in the direction in which the cascade-connected transistors are arranged, its channel region being indicated at 71 and its gate electrode being indicated at WL0. The device isolation MOS transistor Q0 connects, as shown in FIG. 6, with each of the transistors Q4 in adjacent cascade-gate memory cells.

That is, the cascade-gate cell shown in FIGS. 13 and 14 has the device isolation MOS transistor Q0 formed between adjacent memory cells on the semiconductor substrate. The gate electrode WL0 of the transistor Q0 is formed in the same wiring layer as the gate electrodes WL1 to WL4 of the cascade-connected MOS transistors.

The gate potential of the device isolation MOS transistor Q0 is set to ground potential VSS or a negative substrate potential VBB so that it is constantly placed in the off state, thus permitting device isolation between memory cells.

In making an array of such memory cells as described above, therefore, the prior need is eliminated for field oxide layers to be scattered in an area in which the gate lines of cell MOS transistors are arranged with regularity, realizing the pattern regularity (continuity) over the substrate.

Thereby, the IC manufacturing process is made easy and the pattern density can be increased. Moreover, if the pattern regularity is good, a phase shifting pattern exposing technique can be used to form finer patterns.

In addition, the gate electrode WL0 of the device isolation MOS transistor can be formed in the same pattern at the same level above the substrate (on the same wiring layer) by the same process as the gate electrodes WL1 to WL4 of the cascade-connected MOS transistors Q1 to Q4. This permits loss of pattern flatness and adverse effect on polysilicon lines and aluminum lines formed above to be avoided.

Figure 5:
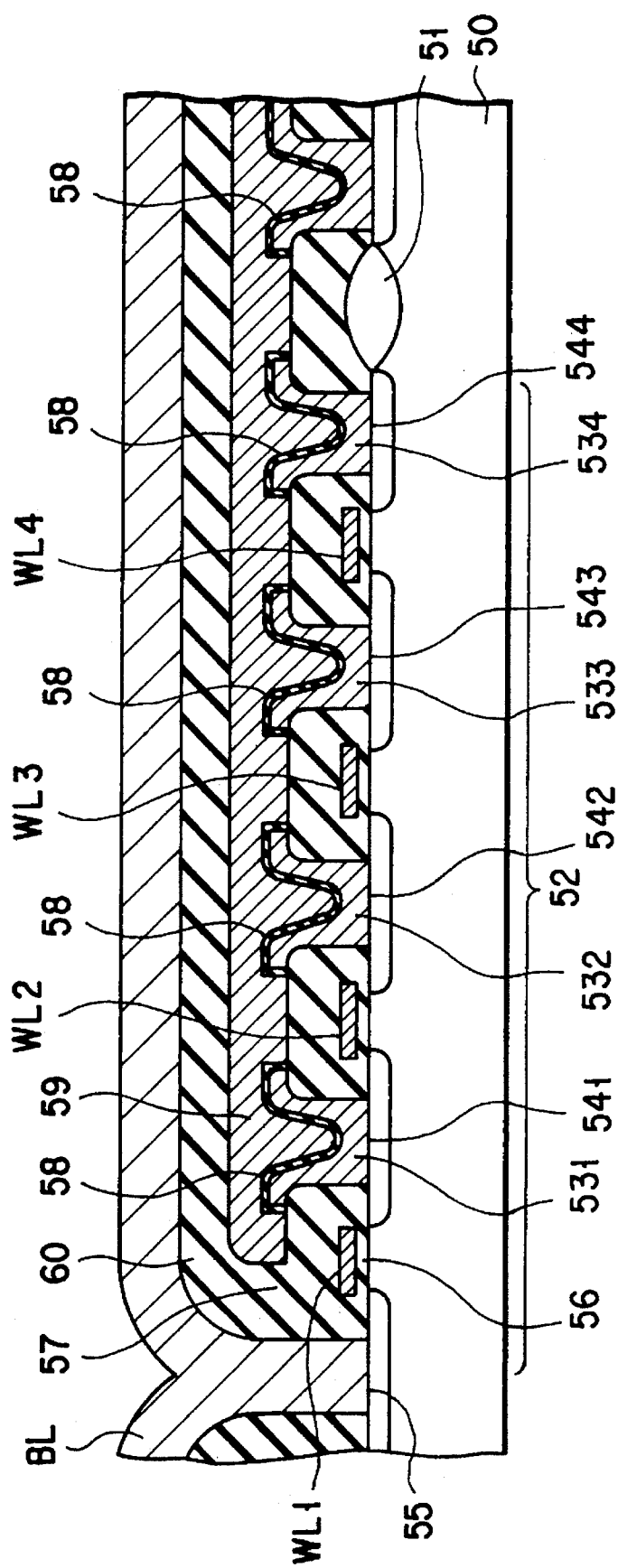
FIG. 5 illustrates an example of a sectional structure of the memory cell of FIG. 2.

The device isolation MOS transistor Q0 need not necessarily be of the same size as the cascade-connected MOS transistors Q1 to Q4. The transistor Q0 may be different in size from the transistors Q1 to Q4. In this case, compared with the case where the MOS transistor Q0 is of the same size as the transistors Q1 to Q4, the pattern regularity on a substrate is a little poor. Compared with the case where a field oxide film (indicated at 51 in FIG. 5) is used for device isolation, however, the pattern regularity and the pattern flatness are good, making the manufacturing process easy and increasing the pattern density.

Here, the pattern area (size) of the cascade-gate DRAM cell described above is compared with the pattern area of the conventional single-transistor single-capacitor DRAM cell shown in FIG. 1.

In the case of a stacked capacitor cell structure of the DRAM cell of FIG. 1, assuming the mask alignment tolerance to be 0.5F, where F is the minimum dimension in manufacture of cells, the limit on reductions of the cell area is said to be $8F^2$.

In the case of the DRAM cell of FIG. 13, on the other hand, assuming the mask alignment tolerance to be 0.5F, the long side of a pattern portion including the transistor Q1 and the capacitor C1 is 4.5F, while the long side of each of pattern portions respectively including a set of Q2 and C2; Q3 and C3; and Q4 and C4 is 3F. Thus, the long side of the entire cell is 13.5F. In the case of a storage system of one bit per capacitor, therefore, the cell length per bit will be 3.375F.

In other words, when the cascade-gate cell is formed into a stacked capacitor cell structure, the pattern for a set of a transistor and a capacitor can, in principle, be implemented with an area of $4F^2$.

As described above, according to the semiconductor memory cell, which has a cascade-gate configuration, the cell area per bit can be reduced considerably using existing process techniques, permitting higher packing density and considerable reduction of cost per bit. Moreover, the manufacturing process can be made easy and the pattern density can be increased.

Therefore, the present invention can implement low-cost large-capacity DRAMs which can effectively be substituted for other types of storage media such as magnetic disk, etc.

The area of each of the capacitors C1 to C4 in the cell of FIGS. 13 and 14 is smaller than that of the capacitor C in the cell of FIG. 1. Thus, it seems that the so-called capacitor capacitance Cs decreases and hence the bit line capacitance Cb/capacitor capacitance Cs increases.

However, sharing the bit-line contact 55 between memory cells, in other words, connecting a pair of DRAM cells to the node N1 as shown in FIG. 6 leads to one bit-line contact for eight bits (½ bit-line contact for four bits). This allows the bit line capacitance Cb to be decreased greatly. The Cs/Cs value rather becomes smaller than before, making variations in potential at the time of reading of data greater. Moreover, a considerable reduction in the bit line capacitance Cb results in a reduction in current dissipation.

If changes to the process were allowed to some extent, a technique disclosed in an article entitled "3-DIMENSIONAL STACKED CAPACITOR CELL FOR 16M AND 64M DRAMS" by T. EMA et al, 1988 IEDM Technical Digest, PP. 592–595 or in an article entitled "Stacked Capacitor Cells for High-density dynamic RAMs" by H. WATANABE et al. pp. 600–603 in the same journal as above could be used to increase the capacitor capacitance Cs. In this case, one bit would be disposed at each intersection of bit line and word line in an array.

The technique of using the device isolation MOS transistor Q0 as described above can be applied to the cells of FIG. 6, and FIGS. 10 through 12 but cannot be applied to the cell of FIG. 8.

Figure 15:
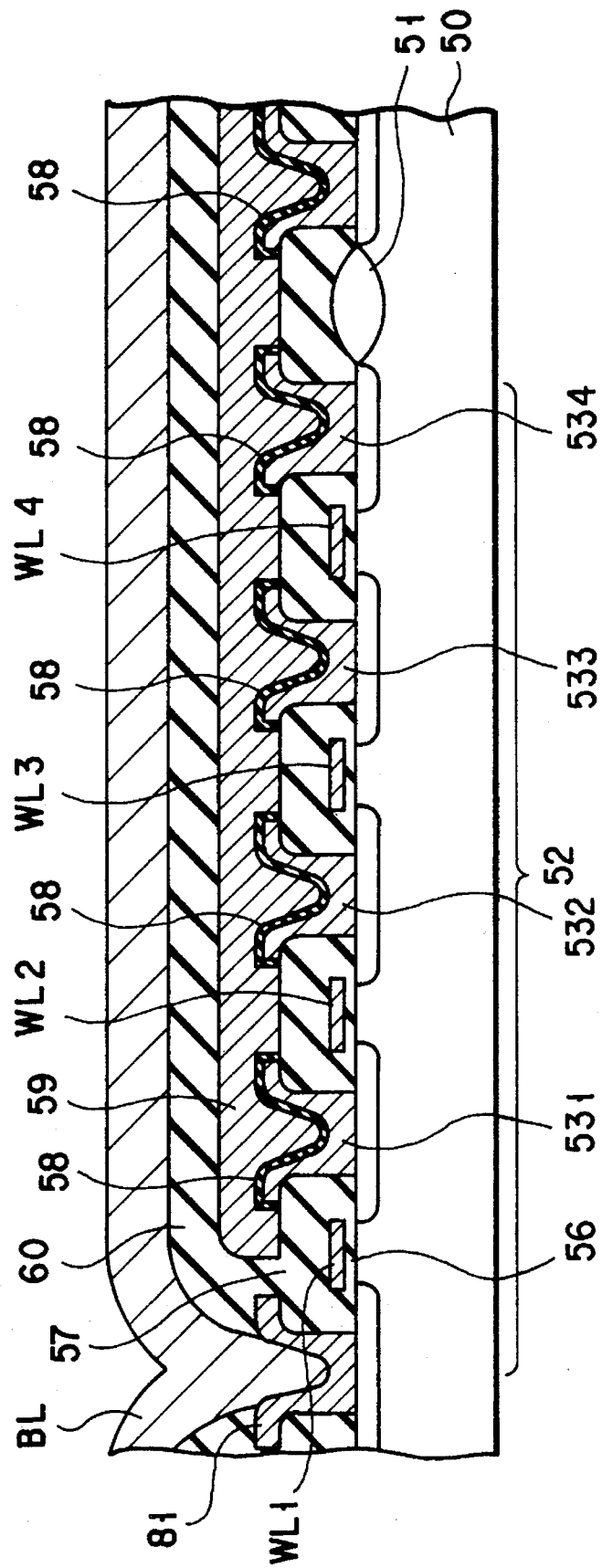
FIG. 15 illustrates another example of the sectional structure of the memory cell of FIG. 6.

FIG. 15 illustrates another example of a sectional structure when the cell of FIG. 6 is implemented as stacked capacitor cell structure and used in an open bit line type of DRAM cell array.

This cascade-gate cell is distinct from the cascade-gate cell shown in FIG. 14 in that the field isolation region 51 is used in place of transistor Q0, a conductor (for example, polysilicon) 81 that is in contact with the end of the active region for the cascade gate is formed, and the bit line BL is in contact with the conductor 81.

In the cascade-gate cell of FIG. 15, the data storage capacitors C1 to C4 have charge storage layers 531 to 534 of polysilicon each of which is in contact with the active region of a corresponding MOS transistor, and the bit line BL is connected to the conductor 81 that is in contact with an end of the cascade-gate active region. The conductor 81 is formed in the same pattern at the same level above the substrate by the same process as the storage node polysilicon layers 531 to 534.

Thus, the charge storage polysilicon layers 531 to 534 of the data storage capacitors C1 to C4 and the conductor 81 are arranged side by side with regularity, realizing the pattern regularity on a substrate.

The existence of the conductor 81 that is in contact with the end of the cascade-gate active region allows mask alignment tolerance for a contact hole to be formed on the conductor to increase and the contact hole to be formed shallow in comparison with the case where the conductor does not exist. Thus, the IC manufacturing process is made easy and the pattern density can be increased.

The technique which forms the conductor 81 that is in contact with the end of the cascade gate active region can be applied to all the cells of FIG. 6, FIG. 8, and FIGS. 10 to 12.

Figure 16:
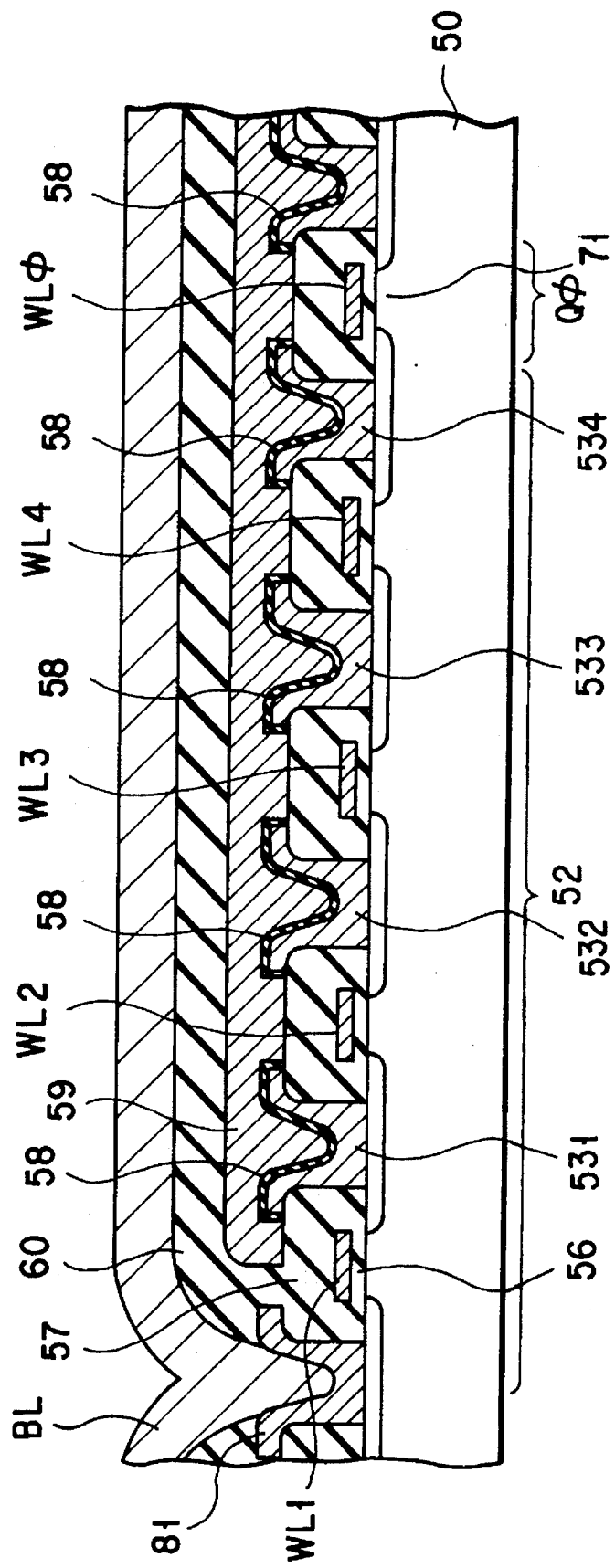
FIG. 16 illustrates still another example of the sectional structure of the memory cell of FIG. 6.

FIG. 16 illustrates still another example of the sectional structure when the cell of FIG. 6 is implemented as stacked capacitor cell structure and used in an open bit line type of DRAM cell array.

This cascade-gate cell combines the feature of the memory cell shown in FIG. 14 and the feature of the memory cell shown in FIG. 15. That is, to the cascade-gate cell shown in FIG. 14 is added the conductor 81 shown in FIG. 15 which is in contact with the end of the cascade-gate active region.

The cascade-gate cell of FIG. 16 is provided with device isolation MOS transistor Q0 between adjacent cells on a semiconductor substrate. The gate electrode WL0 of the transistor Q0 and the gate electrodes WL1 to WL4 of the cascade-connected transistors Q1 to Q4 are formed in the same wiring layer. The conductor 81 is formed in the same wiring layer as the charge storage polysilicon nodes 531 to 534.

The cascade gate cell of FIG. 16 has the advantages of the memory cell of FIG. 14 and the advantages of the memory cell of FIG. 15 which were described previously.

The technique which uses the conductor 81 that is in contact with the end of the cascade-gate active region and the device isolation MOS transistor Q0 can be applied to the cells of FIG. 6 and FIGS. 10 to 12 but cannot be applied to the cell of FIG. 8.

FIG. 17 illustrates another example of a pattern layout when the cell of FIG. 6 is implemented as stacked capacitor cell structure and used in an open bit line type of DRAM cell array.

Figure 18:
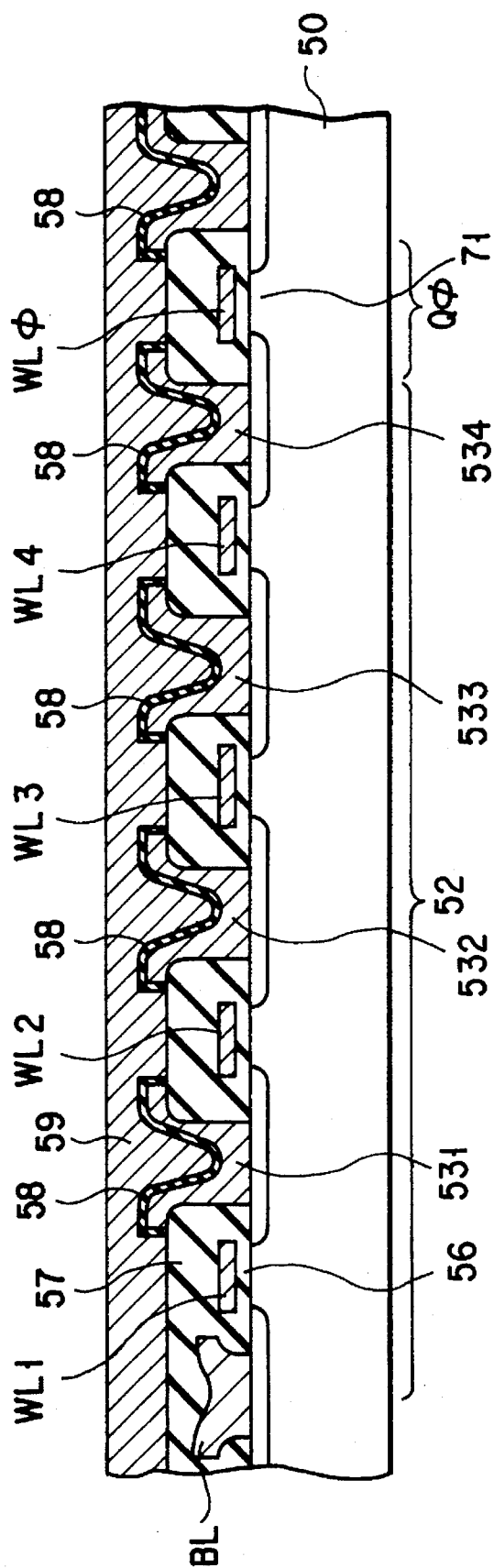
FIG. 18 illustrates an example of a sectional structure in FIG. 17.

FIG. 18 is a sectional view taken along line III—III of FIG. 17.

This cascade-gate cell is applied to a DRAM which uses what is called a bit-line prior manufacture process by which the bit line BL is formed prior to the polysilicon layers for the charge storage nodes 531 to 534. The bit line BL, which is in direct contact with the end of the cascade gate active region, is formed over a device isolation region between semiconductor memory cells which are arranged side by side in the direction perpendicular to the direction in which the cell transistors (cascade-connected transistors Q1 to Q4) are arranged.

The technique which forms the bit line BL over the device isolation region between semiconductor memory cells which are arranged side by side in the direction perpendicular to the direction in which the transistors in a cell are arranged, and brings the bit line BL into direct contact with the end of the cascade-gate active region can be applied to all the cells of FIG. 6, FIG. 8 and FIGS. 10 to 12.

For device isolation between semiconductor memory cells which are arranged side by side in the direction perpendicular to the direction in which the cell transistors are arranged, field oxide film can be used in the above embodiments. Alternatively, the device isolation may be provided by introducing impurities into the semiconductor substrate surface of a device isolation region, forming a polysilicon line over the region with a gate insulating layer interposed therebetween, and supplying ground potential VSS or negative substrate bias potential VBB to the polysilicon line.

Although the preferred embodiments of the present invention have been described and disclosed, it is apparent that other embodiments and modifications are possible.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:

a memory cell array formed of a plurality of dynamic memory cell units on a semiconductor substrate, each of said dynamic memory cell units including:

a first data node;

a first cascade gate connected to said first data node and including a plurality of first MOS transistors which are connected in cascade;

a plurality of data storage capacitors each having a first electrode respectively connected to a corresponding one of said first MOS transistors at an end of said corresponding one of said first MOS transistors which is remote from said first data node;

word lines each respectively connected to a gate of a corresponding one of said first MOS transistors for supplying signals to control the ON/OFF switching of said first MOS transistors; and isolation MOS transistors respectively transistor formed between dynamic memory cell units which are arranged side by side on said semiconductor substrate.

2. A semiconductor memory device comprising:

a first data node;

a first cascade gate, having a cascade gate active region defined on a semiconductor substrate, connected to said first data node and including a plurality of first MOS transistors which are connected in cascade, each of said first MOS transistors having an active region defined by a source region, a drain region, and a channel region on said semiconductor substrate;

a plurality of data storage capacitors each having a first electrode respectively connected to a corresponding one of said first MOS transistors at an end of said corresponding one of said first MOS transistors which is remote from said first data node; and a conductor formed in contact with an end of said cascade gate active region, said conductor being connected to said first data node, wherein the first electrode of each of said data storage capacitors comprises a charge storage electrode which is in contact with an end of the active region of the corresponding one of said first MOS transistors.

3. A semiconductor memory device comprising:

a memory cell array formed of a plurality of dynamic memory cell units, each of said dynamic memory cell units including:

a first data node;

a first cascade gate, having a cascade gate active region defined on a semiconductor substrate, connected to said first data node and including a plurality of first MOS transistors which are connected in cascade, each of said first MOS transistors having an active region defined by a source region, a drain region, and a channel region on said semiconductor substrate;

a plurality of data storage capacitors each having a first electrode respectively connected to a corresponding one of said first MOS transistors at an end of said corresponding one of said first MOS transistors which is remote from said first data node;

isolation MOS transistors respectively transistor formed between dynamic memory cell units which are arranged side by side on said semiconductor substrate; and a conductor formed in contact with an end of said cascade gate active region, said conductor being connected to said first data node, wherein the first electrode of each of said data storage capacitors comprises a charge storage electrode which is in contact with an end of the active region of the corresponding one of said first MOS transistors.

4. The semiconductor memory device according to claim 1, in which each of said cascade-connected first MOS transistors has an active region defined by a source region, a drain region, and a channel region on said semiconductor substrate, the active regions of said cascade-connected first MOS transistors being arranged linearly on said semiconductor substrate, said first electrode of each of said data storage capacitors comprising a charge storage electrode, each of said data storage capacitors further including an insulating film, and a plate electrode and having a stack structure wherein said charge storage electrode is in contact with the source region or the drain region of the corresponding one of said first MOS transistors.

5. The semiconductor memory device according to claim 2, in which the active regions of said cascade-connected first MOS transistors are arranged linearly on said semiconductor substrate, and each of said data storage capacitors further includes an insulating film and a plate electrode and has a stack structure wherein said charge storage electrode is in contact with the source region or the drain region of the corresponding one of said first MOS transistors.

6. The semiconductor memory device according to claim 3, in which the active regions of said cascade-connected first MOS transistors are arranged linearly on said semiconductor substrate, and each of said data storage capacitors further includes an insulating film and a plate electrode and has a stack structure wherein said storage electrode is in contact with the source region or the drain region of the corresponding one of said first MOS transistors.

7. A semiconductor memory device, comprising:

first and second data nodes;

a first cascade gate, having a cascade gate active region defined on a semiconductor substrate, including at least three first MOS transistors connected in cascade between said first and second data nodes, each of said first MOS transistors having an active region defined by a source region, a drain region, and a channel region on said semiconductor substrate;

a plurality of data storage capacitors each having a first electrode respectively connected to a node between adjacent ones of said first MOS transistors;

word lines each respectively connected to a gate of a corresponding one of said first MOS transistors for supplying signals to control the ON/OFF switching of said first MOS transistors; and a conductor formed in contact with an end of said cascade gate active region, said conductor being connected to said first data node, wherein the first electrode of each of said data storage capacitors comprises a charge storage electrode which is in contact with an end of the active region of a corresponding one of said first MOS transistors.

8. The semiconductor memory device according to claim 7, in which the active regions of said cascade-connected first MOS transistors are arranged linearly on said semiconductor substrate, and each of said data storage capacitors further includes an insulating film and a plate electrode and has a stack structure wherein said charge storage electrode is in contact with the source region or the drain region of a corresponding one of said first MOS transistors.

9. The semiconductor memory device according to any one of claims 1, 3, 4, and 6, in which gate electrodes of said isolation MOS transistors are formed on a same wiring layer as gate electrodes of said cascade-connected first MOS transistors.

10. The semiconductor memory device according to any one of claims 2, 3, 5, 6, 7, and 8 in which said conductor which is in contact with an end of said cascade gate active region is formed on a same wiring layer as said charge storage electrodes of said data storage capacitors.

11. The semiconductor memory device according to any one of claims 1 and 4, wherein said first cascade gate has a cascade active region defined on said semiconductor substrate and said semiconductor device further comprises a conductor formed in contact with an end of said cascade gate active region, said conductor being connected to said first data node and is formed on a same wiring layer as said charge storage electrodes of said data storage capacitors.

12. The semiconductor memory device according to any one of claims 2, 3, 5, and 6, further comprising word lines each respectively connected to a gate of a corresponding one of said first MOS transistors for supplying signals to control the on/off switching of said first MOS transistors.

13. The semiconductor memory device according to any one of claims 1 to 3, 4 to 8, in which second electrodes of said data storage capacitors are connected to a common line.

14. The semiconductor memory device according to claim 13, in which said data storage capacitors have a common plate electrode which is supplied with a predetermined capacitor plate potential.

15. The semiconductor memory device according to any one of claims 1 to 3, 4 to 8, in which second electrodes of said data storage capacitors are connected to separate signal lines.

16. The semiconductor memory device according to any one of claims 1 to 3, 4 to 8, in which capacitance values of said data storage capacitors have a predetermined relationship in accordance with a sequence in which data is read out from said data storage capacitors.

17. The semiconductor memory device according to claim 16, in which the predetermined relationship of said capacitance values is such that the capacitor whose data is output last in said sequence has a greater capacitance than the capacitor whose data is output first in said sequence.

18. The semiconductor memory device according to any one of claims 1 to 3, 5 to 8, in which said first data node is connected to a bit line or an input terminal of a sense amplifier of a memory cell array.

19. The semiconductor memory device according to claim 7 or 8, in which one of said first MOS transistors at an end of said cascade gate is selectively placed in the off state, and the remaining transistors of said first MOS transistors are switched on and off in a predetermined sequence.

20. The semiconductor memory device according to claim 7 or 8, in which said first node and said second node are connected together.

21. The semiconductor memory device according to any one of claims 1 to 3, 4 to 8, further comprising an additional dynamic memory cell unit including transistors equal in number to the number of transistors in said dynamic memory cell units, said transistors of said additional dynamic memory cell unit connected in series such that a first terminal of a first transistor in said transistor series is connected to a data node and a first terminal of each remaining transistor in said transistor series is connected to a second terminal of the immediately preceding transistor in said transistor series, wherein second electrodes of said data storage capacitors of one of said first dynamic memory cell units are connected to the second terminals of the transistors of said additional dynamic memory cell unit and gates of said MOS transistors of said additional dynamic memory cell unit being connected to gates of said first MOS transistors of said one of said dynamic memory cell units, respectively.

22. The semiconductor memory device according to any one of claims 1 to 3, in which the number of said first MOS transistors connected in cascade is four, and the number of said data storage capacitors in each of said dynamic memory cell units is four.

23. The semiconductor memory device according to claim 7, in which the number of said first MOS transistors connected in cascade is five, and the number of said data storage capacitors is four.

24. A semiconductor memory device, comprising:

memory cells comprising a plurality of transistors connected in series between first and second data nodes and arranged to extend linearly in a first direction on a major surface of a body of semiconductor material, said plurality of transistors including an isolation transistor, at least two transistors arranged in a first transistor series between said first data node and a first terminal of said isolation transistor, and at least two transistors arranged in a second transistor series between said second data node and a second terminal of said isolation transistor;

gate lines connected to gates of said plurality of transistors;

driving means for driving said gate lines, said driving means driving the gate line connected to said isolation transistor to maintain said isolation transistor in an OFF state and for driving the gate lines connected to the transistors in said first and second transistor series, while said isolation transistor is maintained in the OFF state, to switch said transistors in said first and second transistor series ON and OFF, whereby said isolation transistor electrically isolates said transistors in said first transistor series from said transistors in said second transistor series.

25. The semiconductor memory device according to claim 24, wherein said transistors in said first transistor series are arranged such that a first terminal of a first transistor in said first transistor series is connected to said first data node, the first terminal of each remaining transistor in said first transistor series is connected to a second terminal of the immediately preceding transistor in said first transistor series, and said second terminal of a last transistor in said first transistor series is connected to said first terminal of said isolation transistor, and said transistors in said second transistor series are arranged such that a first terminal of a first transistor in said second transistor series is connected to said second data node, the first terminal of each remaining transistor in said second transistor series is connected to a second terminal of the immediately preceding transistor in said second transistor series, and said second terminal of a last transistor in said second transistor series is connected to said second terminal of said isolation transistor, said memory cells further comprising:

data storage capacitors each having a first electrode respectively connected to the second terminal of a corresponding one of said transistors in said first and second transistor series.

26. The semiconductor memory device according to claim 25, further comprising:

a bit line connected to said first and second data nodes, and wherein said driving means drives said gate lines, while said isolation transistor is maintained OFF, to read data from said data storage capacitors of said memory cells to said bit line and to write data from said bit line to said data storage capacitors of said memory cells.

27. The semiconductor memory device according to claim 26, further comprising:

a precharge circuit for precharging said bit line.

28. The semiconductor memory device according to claim 26, further comprising:

a sense amplifier for sensing and amplifying a potential on said bit line.

29. The semiconductor memory device according to claim 25, further comprising:

a capacitor line to which a second electrode of each of said data storage capacitors is connected.

30. The semiconductor memory device according to claim 25, further comprising:

capacitor lines each respectively coupled to a second electrode of a corresponding one of said data storage capacitors.

31. The semiconductor memory device according to claim 24, wherein said isolation transistor comprises an N-channel enhancement MOS transistor.

32. The semiconductor memory device according to claim 24, wherein said isolation transistor has a size different than a size of the transistors in said first and second transistor series.

33. The semiconductor memory device according to claim 24, further comprising:

a first conductor contacting the first terminal of said first transistor in said first transistor series and electrically connecting said first terminal of said first transistor in said first transistor series to said first data node; and a second conductor contacting the first terminal of said first transistor in said second transistor series and electrically connecting said first terminal of said first transistor in said second transistor series to said second data node.

34. A semiconductor memory device, comprising:

a circuit unit formed on a major surface of a body of semiconductor material comprising:

at least two transistors connected in series such that a first terminal of a first transistor in said transistor series is connected to a first data node and a first terminal of each remaining transistor in said transistor series is connected to a second terminal of the immediately preceding transistor in said transistor series; and data storage capacitors each having a storage electrode respectively connected to the second terminal of a corresponding one of said transistors, an insulating film, and a plate electrode;

a conductor contacting the first terminal of said first transistor in said transistor series and electrically connecting said first terminal of said first transistor in said transistor series to said first data node.

35. A semiconductor memory device, comprising:

a first circuit unit formed on a major surface of a body of semiconductor material comprising:

at least two transistors arranged to extend linearly in a first direction along the major surface of said semiconductor body and connected in a first transistor series such that a first terminal of a first transistor in said first transistor series is connected to a first data node and a first terminal of each remaining transistor in said first transistor series is connected to a second terminal of the immediately preceding transistor in said first transistor series; and first data storage capacitors each having a first terminal respectively connected to the second terminal of a corresponding one of said transistors in said first transistor series;

a second circuit unit formed on said major surface of said semiconductor body and spaced from said first circuit unit in a second direction perpendicular to said first direction, said second circuit unit comprising:

at least two transistors arranged to extend linearly in the first direction along the major surface of said semiconductor body and connected in a second transistor series such that a first terminal of a first transistor in said second transistor series is connected to a first data node and a first terminal of each remaining transistor in said second transistor series is connected to a second terminal of the immediately preceding transistor in said second transistor series; and second data storage capacitors each having a first terminal respectively connected to the second terminal of a corresponding one of said transistors in said second transistor series;

means for electrically isolating said first circuit unit from said second circuit unit; and a bit line connected to the first terminal of the first transistor in said first transistor series and arranged in the space between said first and second circuit unit to extend in the first direction along the major surface of said semiconductor body.

36. The semiconductor memory device according to claim 35, wherein said means for electrically isolating comprises a field oxide film.

37. The semiconductor memory device according to claim 35, wherein said means for electrically isolating comprises:

an impurity region formed in the major surface of said semiconductor body in the space between said first and second circuit units; and a polysilicon layer insulatively spaced from said impurity region and supplied with a potential suitable for electrically isolating said first and second circuit units from each other.

38. The semiconductor memory device according to claim 25, further comprising:

a first conductor contacting the first terminal of said first transistor in said first transistor series and electrically connecting said first terminal of said first transistor in said first transistor series to said first data node; and a second conductor contacting the first terminal of said first transistor in said second transistor series and electrically connecting said first terminal of said first transistor in said second transistor series to said second data node.

39. The semiconductor memory device according to claim 38, wherein said first and second conductors are formed in the same pattern at the same level above said semiconductor substrate as the first electrodes of said data storage capacitors.

* * * * *